(12) United States Patent
Skov et al.

(10) Patent No.: US 9,607,731 B2
(45) Date of Patent: Mar. 28, 2017

(54) DIELECTRIC ELECTROACTIVE POLYMERS COMPRISING AN IONIC SUPRAMOLECULAR STRUCTURE

(71) Applicant: Danmarks Tekniske Universitet, Kgs. Lyngby (DK)

(72) Inventors: Anne Ladegaard Skov, Frederiksberg (DK); Soren Hvilsted, Horsholm (DK); Lidia Gonzalez Burdalo, Copenhagen N (DK)

(73) Assignee: DANMARKS TEKNISKE UNIVERSITET, Kgs. Lyngby (DK)

( * ) Notice: Subject to any disclaimer, the term of this patent is extended or adjusted under 35 U.S.C. 154(b) by 0 days.

(21) Appl. No.: 14/650,041

(22) PCT Filed: Dec. 4, 2013

(86) PCT No.: PCT/EP2013/075578
§ 371 (c)(1),
(2) Date: Jun. 5, 2015

(87) PCT Pub. No.: WO2014/086885
PCT Pub. Date: Jun. 12, 2014

(65) Prior Publication Data
US 2015/0318074 A1    Nov. 5, 2015

(30) Foreign Application Priority Data
Dec. 5, 2012 (EP) .................................... 12195690

(51) Int. Cl.
| C08L 83/04 | (2006.01) |
| H01B 3/28 | (2006.01) |
| C08L 77/06 | (2006.01) |
| H01B 3/30 | (2006.01) |

(52) U.S. Cl.
CPC ............... *H01B 3/28* (2013.01); *C08L 77/06* (2013.01); *C08L 83/04* (2013.01); *H01B 3/307* (2013.01)

(58) Field of Classification Search
CPC ........................................................ C08L 83/04
See application file for complete search history.

(56) References Cited

U.S. PATENT DOCUMENTS

| 4,468,499 A | 8/1984 | Siegfried et al. |
| 8,088,453 B1 | 1/2012 | Rasmussen |
| 8,188,293 B2 | 5/2012 | Tournilhac et al. |
| 2002/0128364 A1 | 9/2002 | Michot et al. |
| 2012/0220725 A1 | 8/2012 | Hidalgo et al. |
| 2014/0328783 A1* | 11/2014 | Geffroy ............... A61K 8/4953 424/64 |
| 2015/0152270 A1* | 6/2015 | Aizenberg .......... A61L 29/085 210/500.27 |
| 2015/0166735 A1* | 6/2015 | Bidault .................. C08J 3/075 424/487 |

FOREIGN PATENT DOCUMENTS

| FR | 2 965 408 | * 3/2012 |
| WO | WO2006087475 A1 | 8/2006 |

OTHER PUBLICATIONS

English language translation FR 2,965,408, Mar. 30, 2012.*
Aboudzadeh, M. A., et al., "Facile Synthesis of Supremolecular Ionic Polymers That Combine Unique Rheological, Ionic Conductivity, and Self-Healing Properties," *Macromolecular Rapid Communications*, 2012, pp. 314-318, vol. 33.
Bakarich, S. E., et al., "Recovery from applied strain in interpenetrating polymer network hydrogels with ionic and covalent crosslinks" *Soft Matter*, 2012, pp. 9985-9988, vol. 8.
Carpi, F., et al., "Silicone-Poly(hexylthiophene) Blends as Elastomers with Enhanced Electromechanical Transduction Properties**," *Advanced Functional Materials*, 2008, pp. 235-241, vol. 18.
Kussmaul, B., et al., "Enhancement of Dielectric Permittivity And Electromechanical Response In Silicone Elastiners: Molecular Grafting Of Organic Dipoles To The Macromolecular Network," *Advanced Functional Materials*, 2011, pp. 4589-4594, vol. 21.
Matysek, M., et al. "Vibrotactile Display for mobile applications based on dielectric elastomer stack actuators," *Proceedings of SPIE—Electroactive Polymer Actuators and Devices (EAPAD)*, San Diego, 2010, pp. 76420D-1-76420D-9, vol. 4642.
Mora-Barrantes, I., et al., "Effect of covalent cross-links on the network structure of thermo-reversible ionic elastomers," *Soft Matter*, 2012, pp. 5201-5213, vol. 8.
Shankar, R., et al., "Electromechanical Response of Nanostructured Polymer Systems with no Mechanical Pre-Strain," *Macromolecular Rapid Communications*, 2007, pp. 1142-1147, vol. 28.
Stoyanov, H., et al., "Dielectric properties and electric breakdown strength of a subpercolative composite of carbon black in thermoplastic copolymer," *Applied Physics Letters*, 2009, pp. 232905-1-232905-3, vol. 94(232905).
International Preliminary Report on Patentability for International Patent Application No. PCT/EP2013/075578, mailed Jun. 18, 2015.

* cited by examiner

*Primary Examiner* — Margaret Moore
(74) *Attorney, Agent, or Firm* — Alston & Bird LLP

(57) ABSTRACT

The present invention relates to an ionic interpenetrating polymer network comprising at least one elastomer and an ionic supramolecular structure comprising the reaction product of at least two chemical compounds wherein each of said compounds has at least two functional groups and wherein said compounds are able to undergo Lewis acid-base reactions. The interpenetrating polymer network may be used as dielectric electroactive polymers (DEAPs) having a high dielectric permittivity.

19 Claims, 1 Drawing Sheet

DIELECTRIC ELECTROACTIVE POLYMERS COMPRISING AN IONIC SUPRAMOLECULAR STRUCTURE

CROSS REFERENCE TO RELATED APPLICATION

Figure 1:
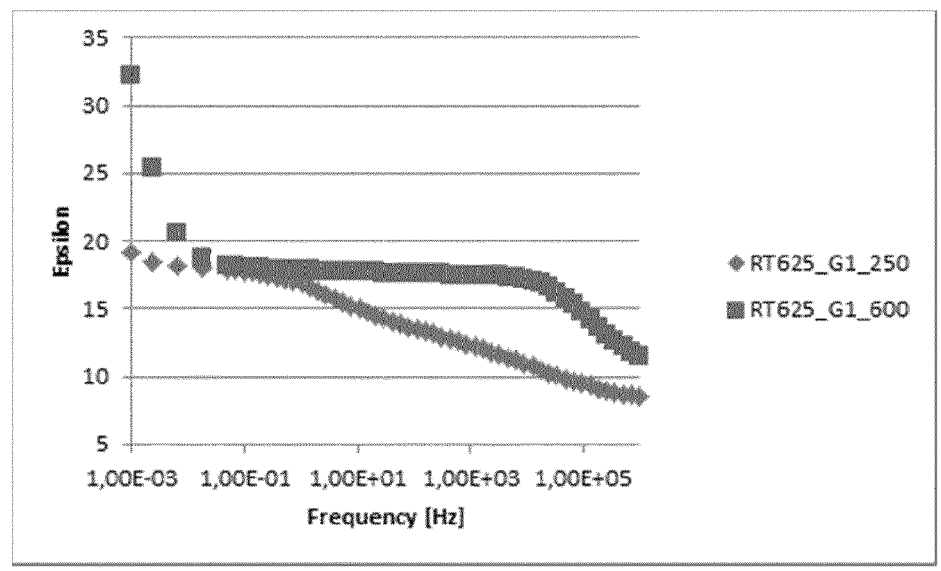

This application is a National Phase of pending PCT Application No. PCT/EP2013/075578, filed Dec. 4, 2013, which claims priority of European Application No. 12195690.8, filed Dec. 5, 2012, which is hereby incorporated herein in its entirety by reference.

FIELD OF THE INVENTION

The present invention relates to an ionic interpenetrating polymer network comprising at least one elastomer and an ionic supramolecular structure, said ionic supramolecular structure comprising the reaction product of at least two chemical compounds wherein each of said compounds has at least two functional groups and wherein said compounds are able to undergo Lewis acid-base reactions. The invention relates in particular to an ionic interpenetrating polymer network comprising an elastomeric matrix incorporating an ionic supramolecular structure for use in electroactive polymers (EAPs) having a high dielectric permittivity.

BACKGROUND OF THE INVENTION

Electroactive polymers (EAPs) are polymers that exhibit a change in size or shape when stimulated by an electric field or reversibly generate energy when motioned. Typically, an EAP is able to undergo a major deformation while sustaining large forces.

The development of elastomeric materials with high dielectric permittivity has attracted increased interest over the last years due to their use in e.g. dielectric electroactive polymers (DEAP's).

Dielectric electroactive polymers are materials in which actuation is caused by electrostatic forces on an elastomeric film sandwiched between two electrodes which squeeze the elastomer upon application of an electric field. When an electric voltage is applied, an electrostatic pressure is exerted on the film, reducing its thickness and expanding its area due to the applied electric field. Examples of EAP's are dielectric elastomers. Dielectric electroactive polymers are used e.g. as actuators as so-called "artificial muscles" and as generators in energy-harvesting.

However, a drawback of DEAP's for a wide range of applications is the high operation voltage, which tends to be several thousand volts when actuation strains higher than 2-3% are wanted. The operation voltage can be reduced by reducing the thickness of the elastomer film, decreasing the mechanical stiffness of the material or increasing the relative dielectric permittivity thereof. A reduction of the thickness to less than 5 μm seems, however, not possible for mass-produced films (Matysek et al., in Proc. SPIE-EAPAD, San Diego, p. 76420D (2010)). A reduction of the stiffness has been shown in a tri-block copolymer using block specific oil as plasticizer (Shankar et al., Macromol. Rapid Comm. 28, 1142-1147 (2007)). An increase in relative dielectric permittivity ($\in^r$) of a material can lead to high electrical energy density with lowered operating voltages. Permittivity enhancement and stiffness reduction was shown by blending a conducting poly(3-hexylthiophene) into a commercially available polydimethylsiloxane (PDMS) elastomer (Carpi et al., Adv. Funct. Mater. 18, 235-241 (2008)). Another approach to enhance dielectric permittivity is attaching or grafting small molecules with high permanent dipoles into an elastomer matrix (Kussmaul et al., Adv. Funct. Mater., 2011, 21, 4589-4594).

However, the prior art dielectric electroactive polymers exhibit a relative dielectric permittivity ($\in_r$) of only about 5-20 at 0.1 Hz and it is envisaged that the energy density of DEAP's should be substantially higher in order to be commercially interesting. Thus the dielectric permittivity seems to be an important tuning parameter for obtaining DEAP's with a high energy density.

OBJECT OF THE INVENTION

It is an object of embodiments of the invention to provide an ionic interpenetrating polymer network having a substantially enhanced relative dielectric permittivity for use as Dielectric ElectroActive Polymer (DEAP) compared to prior art DEAP's while showing only little dielectric loss.

SUMMARY OF THE INVENTION

It has been found by the present inventor(s) that by providing an ionic supramolecular structure comprising the reaction product of at least two chemical compounds wherein each of said compounds has at least two functional groups and wherein said compounds are able to undergo Lewis acid-base reactions and incorporate said supramolecular structure into an elastomer, an ionic interpenetrating polymer network may be obtained having greatly improved relative dielectric permittivity.

So, in a first aspect the present invention relates to an ionic interpenetrating polymer network comprising:
i) At least one elastomer selected from the group consisting of silicone rubber, fluorosilicone rubber, poly(meth) acrylate rubber, chloroprene rubber, polybutadiene rubber, poly(ethylene oxide) rubber, poly(propylene oxide) rubber, polyurethane rubber and mixtures thereof; and
ii) An ionic supramolecular structure comprising the reaction product of at least two chemical compounds wherein each of said compounds has at least two functional groups and wherein said compounds are able to undergo Lewis acid-base reactions.

In a second aspect the present invention relates to a method for preparing the ionic interpenetrating polymer network according to the invention comprising the steps of:
i) mixing said at least two chemical compounds, optionally by the addition of heat, to obtain said ionic supramolecular structure; and
ii) Mixing the ionic supramolecular structure obtained in step i), optionally by the addition of heat, with at least one elastomer.

In a third aspect the present invention relates to a method for preparing the ionic interpenetrating polymer network according to the invention comprising the step of mixing said at least two chemical compounds with at least one elastomer, optionally by the addition of heat.

In a fourth aspect the present invention relates to a use of the ionic interpenetrating polymer network according to the invention as dielectric electroactive polymer (DEAP).

LEGENDS TO THE FIGURE

Figure 2:
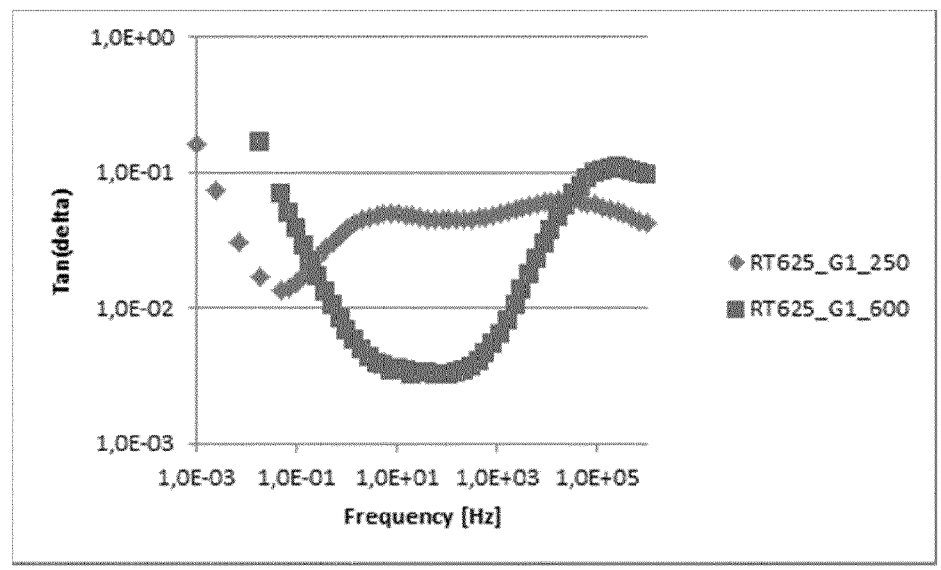

FIG. 1 shows the relative dielectric permittivity as a function of frequency for the ionic interpenetrating polymer networks according to examples 2.2a and 2.2b, respectively, and FIG. 2 shows the dielectric loss as a function of frequency for the same ionic interpenetrating polymer networks.

DETAILED DISCLOSURE OF THE INVENTION

Definitions

In the present context the term "ionic supramolecular structure" refers to molecules formed by bonding smaller molecules or molecular subunits together via ionic bonding.

In the present context the term "ionic interpenetrating polymer network" refers to compositions comprising at least one polymer and an ionic supramolecular structure as defined above at least partially interlaced on a polymer scale.

In the present context the term "elastomer" refers to compositions of matter that have a glass transition temperature, Tg, at which there is an increase in the thermal expansion coefficient, and includes both amorphous polymer elastomers and thermoplastic elastomers (thermoplastics). An elastomer exhibits an elasticity deriving from the ability of the polymer chains of the elastomer to reconfigure themselves to distribute an applied stress. A commercially available elastomer may, in addition to the polymer itself, include fillers and additives. Non-limiting examples of fillers are e.g. reinforcing fillers such as silica and carbon black as well as fillers with e.g. color enhancement such as titanium dioxide.

In the present context the term "backbone" of the at least two chemical compounds means the continuous chain of the molecule in question.

In the present context the term "poly(ethylene glycol)", abbreviated "PEG", refers to a compound of the formula $HO-CH_2-(CH_2-O-CH_2)_n-CH_2-OH$, wherein n is from 2 to 150. PEG's are often labelled according to their molecular weight, and thus e.g. PEG 400 refers to a poly(ethylene glycol) having a molecular weight of approximately 400 daltons.

In the present context the term "poly(propylene glycol)", abbreviated "PPG", refers to a compound of the formula $HO-CH(CH_3)-CH_2-O-(CH_2-CH(CH_3)-O)_n-CH_2-CH(CH_3)-O-CH_2-CH(CH_3)-OH$, wherein n is from 2 to 150.

In the present context the term "polysiloxane" refers to a compound of the form $R_2SiO$, wherein R is a hydrocarbon group.

In the present context the term "polydimethylsiloxane", abbreviated "PDMS", refers to a compound of the formula $CH_3[Si(CH_3)_2O]_nSi(CH_3)_3$, where n is the number of repeating units.

In the present context the term "polyurethane", abbreviated "PU" refers to a compound having repeat units of the formula $-[R-O-C(O)-N(H)-R'-N(H)-C(O)-O-]_n-$, wherein R and R' are alkyl or aryl groups and n is the number of repeating units.

In the present context the term "alkyl" means a linear, cyclic or branched hydrocarbon group having 1 to 24 carbon atoms, such as methyl, ethyl, propyl, iso-propyl, cyclopropyl, butyl, iso-butyl, tert-butyl, cyclobutyl, pentyl, cyclopentyl, hexyl, and cyclohexyl.

The term "alkylene" is used in the following to specify moieties derived from alkanes in which two H atoms have been removed to form a diradical species. The simplest alkylene is methylene $-CH_2-$, and other alkylenes include ethylene $-CH_2-CH_2-$, propylene $-C_3H_6-$ and butylene $-C_4H_8-$. The term "alkylene" includes branched, linear and cyclic alkylenes, with linear alkylenes being most preferred.

In the present context the term "alkenyl" means a linear, cyclic or branched hydrocarbon groups having 2 to 24 carbon atoms, and comprising (at least) one unsaturated bond. Examples of alkenyl groups are vinyl, allyl, butenyl, pentenyl, hexenyl, heptenyl, octenyl, nonenyl and decaenyl. Preferred examples of alkenyl are vinyl, allyl, butenyl, especially allyl.

The term "alkenylene" is used in the following to specify moieties derived from alkenes in which two H atoms have been removed to form a diradical species. Examples include ethenylene $-CH_2=CH_2-$ and propenylene $-C_3H_4-$ moieties. The term "alkenylene" includes branched, linear and cyclic alkenylene, with linear alkenylene being most preferred.

The term "halogen" includes fluoro, chloro, bromo, and iodo.

In the present context the term "aryl" refers to an unsaturated cyclic system. Aryl groups may comprise from 4-12 atoms, suitably from 6-8 atoms, most suitably 6 atoms. "Aryl" is preferably phenyl ($-C_6H_5$).

In the present context, the term "aromatic" is intended to mean a carbocyclic ring system, such as phenyl, naphthyl, 1,2,3,4-tetrahydronaphthyl, anthracyl, phenanthracyl, pyrenyl, benzopyrenyl, fluorenyl and xanthenyl.

In the present context the term "heteroaromatic" is intended to mean an aromatic carbocyclic ring system where one or more of the carbon atoms have been replaced with heteroatoms, e.g. nitrogen ($=N-$ or $-NH-$), sulphur, and/or oxygen atoms. Examples of such heteroaryl groups are oxazolyl, isoxazolyl, thiazolyl, isothiazolyl, pyrrolyl, imidazolyl, pyrazolyl, pyridinyl, pyrimidinyl, pyrazinyl, pyridazinyl, triazinyl, coumaryl, furanyl, thienyl, quinolyl, benzothiazolyl, benzotriazolyl, benzodiazolyl, benzooxozolyl, phthalazinyl, phthalanyl, triazolyl, tetrazolyl, isoquinolyl, acridinyl, carbazolyl, dibenzazepinyl, indolyl, benzopyrazolyl, phenoxazonyl. Particularly interesting heteroaryl groups are benzimidazolyl, oxazolyl, isoxazolyl, thiazolyl, isothiazolyl, pyrrolyl, imidazolyl, pyrazolyl, pyridinyl, pyrimidinyl, pyrazinyl, pyridazinyl, furyl, thienyl, quinolyl, triazolyl, tetrazolyl, isoquinolyl, indolyl in particular benzimidazolyl, pyrrolyl, imidazolyl, pyridinyl, pyrimidinyl, furyl, thienyl, quinolyl, tetrazolyl, and isoquinolyl.

In the present context the term "dendrimer" denotes repetitively branched molecules. A dendrimer is typically symmetric around a core and often adopts a spherical three-dimensional morphology. Examples of dendrimers include poly(ethylene imine) dendrimers and poly(propylene imine) dendrimers. Dendrimers of different generations can be prepared. The generation number, such as G1, G2, and G3, respectively, indicates the number of different branch points such that generation G0 is a simple star, generation G1 will be a star with the ends of the chains acting as branch points and so forth.

In the present context the term "∈" is synonomous with the term "$\in_r$" and stands for relative dielectric permittivity, i.e. the ratio of the amount of electrical energy stored in a material by an applied voltage, relative to that stored in a vacuum. The term "relative dielectric permittivity" is used in the present context interchangeably with the term "relative permittivity".

Specific Embodiments of the Invention

In an embodiment of the invention the elastomer is at least one silicone rubber selected from the group consisting of RTV (Room Temperature Vulcanizing) silicone rubbers, HTV (High Temperature Vulcanizing) silicone rubbers and LSR (Liquid Silicone Rubbers).

In an embodiment of the invention the elastomer is a silicone rubber selected from the group consisting of polysiloxanes, such as a polyalkylsiloxane, preferably polydimethylsiloxane (PDMS). A preferred silicone rubber is an RTV silicone such as silica-reinforced PDMS (PolyDiMethylSiloxane). An example of a commercially available silica-reinforced PDMS is Sylgard™ 184 from Dow Corning or Elastosil RT625 from Wacker Chemie AG.

In an embodiment of the invention the ionic supramolecular structure comprises the reaction product of at least two chemical compounds, of which at least one of said compounds comprises a backbone selected from the group consisting of poly(ethylene) glycol, poly(propylene) glycol, polysiloxane, polyalkylsiloxane, polyurethane and mixtures thereof.

In an embodiment of the invention the backbone is selected from the group consisting of poly(ethylene) glycol (PEG), poly(propylene) glycol (PPG), polydimethylsiloxane and mixtures thereof. Thus PEG and PPG backbones provide good flexibility and low Tg's which is advantageous in terms of potentially good compatibility.

In an embodiment of the invention the ionic supramolecular structure comprises the reaction product of at least two chemical compounds, wherein at least one of these comprises at least two amine functional groups and is selected from the group consisting of $NH_2$—$R^1$—$NH_2$, wherein Fe is selected from the group consisting of linear and branched $C_{1-24}$alkyl and $C_{2-24}$alkenyl and cyclic $C_{3-24}$alkyl and $C_{3-24}$alkenyl, optionally substituted by one or more substituents selected from the group consisting of halogen, amino, nitro, hydroxyl, and $CF_3$; di- or triamino-$C_{1-24}$alkylamine, wherein the alkyl moiety thereof is linear or branched $C_{1-24}$alkyl or cyclic $C_{3-24}$alkyl, optionally substituted by one or more substituents selected from the group consisting of halogen, amino, nitro, hydroxyl, and $CF_3$; di- or triamino-$C_{2-24}$alkenylamine, wherein the alkenyl moiety thereof is linear or branched $C_{2-24}$alkenyl or cyclic $C_{3-24}$alkenyl, optionally substituted by one or more substituents selected from the group consisting of halogen, amino, nitro, hydroxyl, and $CF_3$; di-, tri- or tetraamino-substituted aromatic or heteroaromatic compounds, which compounds are optionally substituted by one or more substituents selected from the group consisting of halogen, amino, nitro, hydroxyl, and $CF_3$; poly(ethylene imine) dendrimers; poly (propylene imine) dendrimers; poly(ethylene glycol) diamine; poly(propylene glycol) diamine; poly(ethylene glycol)/poly(propylene glycol) diamine; poly(ethylene glycol) triamine; poly(propylene glycol) triamine; poly(ethylene glycol)/poly(propylene glycol) triamine; and amino-$C_{1-6}$alkyl terminated polyalkylsiloxane.

In an embodiment of the invention said chemical compound comprising at least two amine functional groups is selected from the group consisting of 1,3-diaminopropane, 1,4-diaminobutane, 1,5-diaminopentane, hexamethylene diamine (HMDA), 1,10-decanediamine, 2,4,6-triaminopyrimidine (TAP), (tris-2-aminoethyl) amine (TAEA), 3,3'-diaminobenzidine (DAB), poly(propylene imine) dendrimer (G1), poly(propylene imine) dendrimer (G2), poly(propylene imine) dendrimer (G3), poly(propylene glycol) diamine, poly(ethylene glycol) diamine, poly(ethylene glycol)/poly (propylene glycol) diamine, poly(propylene glycol) triamine, poly(ethylene glycol) triamine, poly(ethylene glycol)/poly(propylene glycol) triamine, aminopropyl terminated polydimethylsiloxane (ATDMS) and copolymers of aminoalkylmethylsiloxane and dimethylsiloxane, such as copolymers of aminopropylmethylsiloxane and dimethylsiloxane. Commercially available polyetheramines include amines of the Jeffamines® D Series (D400, D2000), Jeffamines® ED Series such as ED2003, Jeffamines® EDR Series (EDR-148, EDR-176), Jeffamines® triamines (T series) (T403, T3000, T5000) from Huntsman, and commercially available aminoalkylterminated polyalkylsiloxanes, such as aminopropylterminated polydimethylsiloxanes, include DMS-A15 and DMS-A31 from Gelest, Inc. The poly(propylene imine) dendrimer (G1), poly(propylene imine) dendrimer (G2), poly(propylene imine) dendrimer (G3) may be obtained commercially from SYMO-Chem B.V., The Netherlands.

In an embodiment of the invention the ionic supramolecular structure comprises the reaction product of at least two chemical compounds, wherein at least one of these comprises at least two carboxy, sulfonic or phosphonic acid functional groups or anhydrides thereof and is selected from the group consisting of di-, tri- or tetra-carboxy-, di-, tri- or tetra-sulfonic or di-, tri- or tetraphosphonic acid-substituted linear or branched, saturated or unsaturated aliphatic, aromatic or heteroaromatic compounds optionally substituted by one or more substituents selected from the group consisting of halogen, amino, nitro, hydroxyl, and $CF_3$; alkylenediaminetetracarboxylic acid; dialkylenetriaminepentacarboxylic acid, poly(ethylene glycol)biscarboxymethyl ether, poly(propylene glycol)biscarboxymethyl ether, α,ω-disulfonate-functionalized poly(ethylene glycol) and α,ω-disulfonate-functionalized poly(propylene glycol).

In an embodiment of the invention said chemical compound comprising at least two carboxy, sulfonic or phosphonic acid functional groups is selected from the group consisting of citric acid (CA), tricarballylic acid (TCAA), trimesic acid (TMA), ethylenediaminetetraacetic acid (EDTA), diethylenetriaminepentaacetic acid (DETPA), poly (ethylene glycol)biscarboxymethyl ether, poly(propylene glycol)biscarboxymethyl ether, α,ω-disulfonate-functionalized poly(ethylene glycol), α,ω-disulfonate-functionalized poly(propylene glycol) and α,ω-dicarboxylate-functionalized dimethylsiloxane.

Further non-limiting examples of the above chemical compound comprising at least two carboxy or sulfonic acid functional groups include a chemical compound selected from the group consisting of oxalic acid, malonic acid, succinic acid, glutaric acid, adipic acid, pimelic acid, suberic acid, azelic acid, sebacic acid, undecanedioic acid, dodecanediocic acid, tridecanedioic acid, tetradecanedioic acid, hexadecanedioic acid, fumaric acid, maleic acid, maleic anhydride, phthalic acid, phthalic anhydride, isophthalic acid, and terepthalic acid, and 1,4-, 2,3-, and 2,6-naphthalenedicarboxylic acid In an embodiment according to the invention the ionic interpenetrating polymer network further comprises one or more additives, such as fillers or reinforcing substances.

In an embodiment of the invention said additive is selected from the group consisting of particles such as $SiO_2$, $TiO_2$, $BaTiO_3$, $CaCu_3Ti_4O_{12}$, or resins such as Vinyl Q resins from Gelest Inc. In a preferred embodiment of the invention the additive is $SiO_2$. Such additives may be present in a commercially available elastomer or may be added to the ionic interpenetrating polymer network separately. The amount of additive necessary will vary widely depending on the ionic interpenetrating polymer network in question but usually is in the range 0-40% by weight, such as 5-30% by weight, such as 10-25% by weight of the ionic interpenetrating polymer network.

In an embodiment of the invention the ionic interpenetrating polymer network has a relative dielectric permittivity $\in_r$ at 0.1 Hz of at least $1 \times 10^1$, such as at least $1 \times 10^2$, preferably at least $1\times10^3$, such as at least $1\times10^4$, more preferred at least $1\times10^5$, such as at least $1\times10^6$. Thus it has surprisingly been found that the ionic interpenetrating polymer networks according to the invention provide unexpected properties such as a high dielectric permittivity over a broad range of frequencies combined with a low degree of dielectric dissipation. This means that the ionic interpenetrating polymer networks will be highly efficient without any substantial loss of dielectric energy. Furthermore the ionic interpenetrating polymer networks according to the invention are contemplated to maintain their elastic moduli and thus their desired mechanical properties.

In an embodiment of the invention the preparation of the ionic supramolecular structure is performed by mixing of stoichiometric amounts of said at least two chemical compounds.

In an embodiment of the invention the preparation of the ionic supramolecular structure is performed by mixing a molar surplus of either one of said at least two chemical compounds, such as wherein one of said at least two chemical compounds is present in a molar ratio of at least 1.25:1 over the at least one further compound, such as a ratio of about 1.5:1, such as a ratio of about 2:1.

In an embodiment of the invention the preparation of the ionic supramolecular structure is performed in the absence of a solvent. Thus preparation of the ionic supramolecular structure may be performed by simple mixing of said at least two chemical compounds neat with or without heating. The degree of heating needed, if any, depends on the specific chemical compounds used.

In an embodiment of the invention the preparation of the ionic interpenetrating polymer network is performed as a two-steps process, wherein step one comprises preparation of the ionic supramolecular structure by mixing of said at least two chemical compounds, followed by mixing of said ionic supramolecular structure with at least one elastomer. In another embodiment of the invention the preparation of the ionic interpenetrating polymer network is performed as a one-step process comprising the step of mixing said at least two chemical compounds with at least one elastomer.

In an embodiment of the invention the preparation of the ionic interpenetrating polymer network is performed by mixing of amounts of said ionic supramolecular structure and said at least one elastomer in the range 1:9 to 2:1 by weight, such as in the range 1:4 to 1:3, preferably about 1:1 by weight. The preparation of the ionic interpenetrating polymer network is preferably performed by mixing of about equal amounts by weight of said ionic supramolecular structure and said at least one elastomer.

In an embodiment of the invention the preparation of the ionic interpenetrating polymer network is performed in the absence of a solvent. Thus preparation of the ionic interpenetrating polymer network may be performed by providing the elastomer and adding said at least two chemical compounds neat whereby the ionic supramolecular structure is formed in situ. Subsequent mixing to obtain a homogenous mixture is performed, with or without heating, whereupon the ionic interpenetrating polymer network is cured in a manner known per se, such as by heating to a temperature in the range 60-130° C., such as about 70-120° C., such as about 70-110° C., such as about 60-100° C., such as about 70-90° C., such as about 80° C. for a period of time depending on the elastomer used, such as a period of time of about 12-24 hours, such as about 20 hours.

In an embodiment of the invention the curing may take place by means of UV radiation in a manner known per se.

In an embodiment of the invention the ionic supramolecular structure is covalently grafted to at least one elastomer. In order to graft the ionic supramolecular structure onto an elastomer the ionic supramolecular structures may be derivatized to comprise olefinic terminated groups, e.g. by converting some of the primary amino groups of the amines suggested into allyl end groups whereupon, due to said vinyl and allyl end groups, the elastomer, such as a PDMS chain and the ionic supramolecular structures will be able to be grafted into Si—H groups in a competitive reaction.

The invention is disclosed in more detail below by means of the following non-limiting examples.

EXAMPLE 1

General Description of the Preparation of Ionic Supramolecular Polymers

A number of different ionic supramolecular polymers having the compositions as listed in Table 1 below were prepared as follows. Silica ($SiO_2$) was used as model for a silicone elastomer.

The ionic supramolecular structures (entries 1-7, 9 and 19-22 below) were prepared by simple mixing of stoichiometric amounts of HMDA or TAEA or poly(propylene imine) dendrimers (PPI G1 and PPI G2) and the different dicarboxylic acids (DiCOOH-PEG 250 and 600, respectively) without the use of solvent followed by manual stirring. A network formation was directly observable as the formation of these ionic systems was exothermic. Furthermore, a viscosity increase of the mixtures could be observed. In the case of the ionic supramolecular structure (entry 11) heating was needed since DiCOOH-PEG 4756 is a solid. The ionic supramolecular structures (entries 12-18) were prepared by simply mixing followed by magnetically stirring of stoichiometric amounts of the different Jeffamines® used (D400 and D2000) and the different carboxylic acids (CA, TCAA, TMA, EDTA and DETPA) without the use of solvent. No heating developed in these cases. The mixtures were subjected to heating for 25 min at 100° C., 25 min at 150° C. and finally 30 min at 200° C. since the carboxylic acids (CA, TCAA, TMA, EDTA and DETPA) are solid and have moderate-high melting points. Once the carboxylic acids were melted and hence ionic supramolecular structures formed, an increase of viscosity was observed. The ionic supramolecular structures including 10% of hydrophobic fumed $SiO_2$ particles (entries 8 and 10) were prepared by formation of the ionic supramolecular structures by simple mixing followed by manual stirring without the use of solvent as the first step, and secondly, the silica particles were added. A Speed Mixer instrument was used in order to get homogeneously dispersed mixtures. The instrument was set at 3000 rpm for 3 min. This procedure was repeated 5-6 times. The numbers reporting the various ratios of the constituents of the mixtures employed always refer to the particular functionality.

The relative permittivities of the ionic supramolecular structures obtained above were determined by means of dielectric relaxation spectroscopy on a Novocontrol Alpha-A high performance frequency analyzer. The results thereof appear from Table 1 below.

TABLE 1

Relative permittivities (∈') of ionic supramolecular structures.

| | | Relative permittivities (∈') | | | | | | | |
|---|---|---|---|---|---|---|---|---|---|
| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | HMDA + DiCOOH-PEG 250 (1:1) | $2.9 \cdot 10^6$ | $9.0 \cdot 10^5$ | $1.5 \cdot 10^5$ | $1.0 \cdot 10^4$ | $2.7 \cdot 10^2$ | $9.0 \cdot 10^1$ | $3.5 \cdot 10^1$ | 17.3 |
| 2 | TAEA + DiCOOH-PEG 250 (1:1.5) | $3.8 \cdot 10^3$ | $1.3 \cdot 10^2$ | $2.0 \cdot 10^1$ | 8.4 | 3.9 | 2.3 | 1.7 | 1.4 |
| 3 | PPI G1 + DiCOOH-PEG 250 (1:2) | $8.1 \cdot 10^5$ | $2.9 \cdot 10^5$ | $6.7 \cdot 10^4$ | $6.0 \cdot 10^3$ | $3.2 \cdot 10^2$ | $9.3 \cdot 10^1$ | $8.6 \cdot 10^1$ | 16.0 |
| 4 | PPI G2 + DiCOOH-PEG 250 (1:4) | $5.9 \cdot 10^4$ | $2.7 \cdot 10^4$ | $1.2 \cdot 10^4$ | $2.4 \cdot 10^3$ | $1.8 \cdot 10^2$ | $2.2 \cdot 10^1$ | 6.7 | 4.4 |
| 5 | HMDA + DiCOOH-PEG 600 (1:1) | $2.6 \cdot 10^6$ | $9.7 \cdot 10^5$ | $2.2 \cdot 10^5$ | $2.2 \cdot 10^4$ | $4.0 \cdot 10^2$ | $4.7 \cdot 10^1$ | $2.7 \cdot 10^1$ | 15.5 |
| 6 | TAEA + DiCOOH-PEG 600 (1:1.5) | $1.3 \cdot 10^4$ | $3.9 \cdot 10^3$ | $1.5 \cdot 10^3$ | $5.2 \cdot 10^2$ | $1.2 \cdot 10^2$ | $1.2 \cdot 10^1$ | 3.4 | 2.9 |
| 7 | PPI G1 + DiCOOH-PEG 600 (1:2) | $1.3 \cdot 10^6$ | $3.8 \cdot 10^5$ | $6.3 \cdot 10^4$ | $4.7 \cdot 10^3$ | $1.6 \cdot 10^2$ | $4.7 \cdot 10^1$ | $6.9 \cdot 10^1$ | 14.3 |
| 8 | PPI G1 + DiCOOH-PEG 600 (1:2) + 10% $SiO_2$ | $1.2 \cdot 10^6$ | $2.9 \cdot 10^5$ | $3.3 \cdot 10^4$ | $7.5 \cdot 10^2$ | $7.2 \cdot 10^1$ | $3.3 \cdot 10^1$ | $6.5 \cdot 10^1$ | 11.5 |
| 9 | PPI G2 + DiCOOH-PEG 600 (1:4) | $1.9 \cdot 10^6$ | $9.0 \cdot 10^4$ | $5.8 \cdot 10^4$ | $4.0 \cdot 10^3$ | $5.8 \cdot 10^2$ | $1.0 \cdot 10^2$ | $4.6 \cdot 10^1$ | 25.5 |
| 10 | PPI G2 + DiCOOH-PEG 600 (1:4) + 10% $SiO_2$ | $6.0 \cdot 10^5$ | $1.2 \cdot 10^5$ | $1.4 \cdot 10^4$ | $2.9 \cdot 10^2$ | $4.5 \cdot 10^1$ | $1.8 \cdot 10^1$ | 9.5 | 6.6 |
| 11 | PPI G1 + DiCOOH-PEG 4756 (1:2) | $1.7 \cdot 10^1$ | 2.1 | 1.1 | $6.1 \cdot 10^{-1}$ | $3.4 \cdot 10^{-1}$ | $2.3 \cdot 10^{-1}$ | $2 \cdot 10^{-1}$ | $1.9 \cdot 10^{-1}$ |
| 12 | CA + D400 (1:1.5) | $7.9 \cdot 10^3$ | $8.5 \cdot 10^2$ | $7.1 \cdot 10^1$ | 8.9 | 4.3 | 2.8 | 2.2 | 1.9 |
| 13 | CA + D2000 (1:1.5) | $2.3 \cdot 10^4$ | $1.5 \cdot 10^3$ | $4.5 \cdot 10^1$ | $1.2 \cdot 10^1$ | $1.1 \cdot 10^1$ | 8.8 | 6.6 | 5.7 |
| 14 | TCAA + D400 (1:1.5) | $2.0 \cdot 10^4$ | $1.1 \cdot 10^3$ | $2.3 \cdot 10^1$ | 6.6 | 5.2 | 3.4 | 2.4 | 1.9 |
| 15 | TCAA + D2000 (1:1.5) | $1.9 \cdot 10^4$ | $1.1 \cdot 10^3$ | $3.5 \cdot 10^1$ | 10.0 | 9.3 | 8.1 | 6.2 | 5.3 |
| 16 | TMA + D2000 (1:1.5) | $6.5 \cdot 10^1$ | 9.1 | 4.8 | 3.7 | 2.6 | 2.2 | 1.9 | 1.8 |
| 17 | EDTA + D2000 (1:2) | $1.1 \cdot 10^3$ | $3.8 \cdot 10^1$ | 9.0 | 8.1 | 7.7 | 6.6 | 5.7 | 5.2 |
| 18 | DETPA + D2000 (1:2.5) | $1.0 \cdot 10^2$ | $1.1 \cdot 10^1$ | 8.6 | 8.1 | 6.8 | 5.9 | 5.5 | 5.1 |
| 19 | D400 + DiCOOH-PEG 250 (1:1) | $9.7 \cdot 10^5$ | $1.8 \cdot 10^5$ | $1.8 \cdot 10^4$ | $3.4 \cdot 10^2$ | $3.2 \cdot 10^1$ | $2.0 \cdot 10^1$ | $1 \cdot 10^1$ | 6.5 |
| 20 | D2000 + DiCOOH-PEG 250 (1:1) | $5.9 \cdot 10^5$ | $9.6 \cdot 10^4$ | $7.6 \cdot 10^3$ | $1.8 \cdot 10^2$ | $1.5 \cdot 10^1$ | $1.1 \cdot 10^1$ | $1 \cdot 10^1$ | 7.6 |
| 21 | D400 + DiCOOH-PEG 600 (1:1) | $6.6 \cdot 10^4$ | $2.5 \cdot 10^4$ | $6.8 \cdot 10^3$ | $7.8 \cdot 10^2$ | $2.9 \cdot 10^1$ | 9.5 | 7.5 | 5.5 |
| 22 | D2000 + DiCOOH-PEG 600 (1:1) | $4.3 \cdot 10^5$ | $7.4 \cdot 10^4$ | $5.6 \cdot 10^3$ | $1.3 \cdot 10^2$ | $1.2 \cdot 10^1$ | 9.8 | 9.2 | 7.6 |

EXAMPLE 2

Preparation of Ionic Interpenetrating Polymer Networks (IPNs)

Ionic interpenetrating polymer networks (IPNs) were prepared by mixing of equal amounts by weight of the elastomer Elastosil® RT625 A/B from Wacker Chemie AG and different supramolecular structures. Elastosil® RT625 A/B is a two parts kit to be used in a 9:1 ratio of Part A to Part B as the manufacturer recommends. The supramolecular structures were formed by simple mixing of stoichiometric amounts of poly(propylene imine) dendrimer (PPI G1) and two dicarboxylic acids (DiCOOH-PEG 250 and 600, respectively) without any use of solvent.

2.1 Preparation of Elastomer

Elastosil® RT625 A/B was used in the ratio 9:1 by mixing 9.0196 g of A and 1.0064 g of B. The mixture was prepared using a Speed Mixer instrument set at 3500 rpm for 60 s.

2.2 Preparation of Ionic Interpenetrating Polymer Networks

The ionic interprenetrating polymer networks (IPNs) were prepared by mixing of equal amounts by weight of Elastosil RT625 A/B and the ionic networks formed in situ (PPI G1+DiCOOH-PEG 600 or PPI G1+DiCOOH-PEG 250) as follows:

2.2.a Elastosil RT625 A/B+(PPI G1-DiCOOH-PEG 250 (1:2))

1.2911 g of Elastosil RT625 A/B as prepared above in 2.1 was placed in a mixer, and the PPI dendrimer G1 (0.5087 g) and finally the dicarboxylic acid DiCOOH-PEG250 (0.7958 g) were added. The mixture was put into the speed mixer for 3 min at 3500 rpm. Afterwards, the mixture was cured in the oven at 80° C. for 21 h. The thickness of the samples was about 2.5-3 mm.

2.2b Elastosil RT625 A/B+(PPI G1-DiCOOH-PEG 600 (1:2))

1.2135 g of Elastosil RT625 A/B as prepared above in 2.1 was placed in a mixer, and the PPI dendrimer G1 (0.2564 g) and finally the dicarboxylic acid DiCOOH-PEG600 (0.9790 g) were added. The mixture was put into the speed mixer for 3 min at 3500 rpm. Afterwards, the mixture was cured in the oven at 80° C. for 21 h.

The relative permittivities of the ionic interpenetrating polymer networks obtained above were determined by means of dielectric relaxation spectroscopy on a Novocontrol Alpha-A high performance frequency analyzer. The results thereof appear from Table 2 below and FIG. 1.

| | | Relative permittivities ($\in_r$) | | | | | | | | |
|---|---|---|---|---|---|---|---|---|---|---|
| Entry | Composition | 0.1 Hz | 1 Hz | 10 Hz | 20 Hz | $10^2$ Hz | $10^3$ Hz | $10^4$ Hz | $10^5$ Hz | $10^6$ Hz |
| 1 | RT625 + (PPI G1 + DiCOOH-PEG 250 (1:2)) (1:1) | 17.8 | 16.8 | 15.0 | 14.5 | 13.5 | 12.2 | 10.7 | 9.3 | 8.5 |
| 2 | RT625 + (PPI G1 + DiCOOH-PEG 600 (1:2)) (1:1) | 17.8 | 17.7 | 17.6 | 17.6 | 17.5 | 17.5 | 17.1 | 14.2 | 11.4 |

EXAMPLE 3

The following ionic supramolecular structures were prepared analogously to the procedure described in Example 1. Heating was not applied in this example.

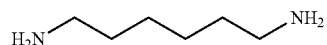
HMDA

+

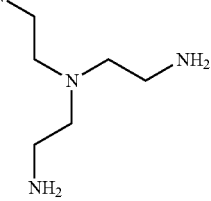
TAEA

+

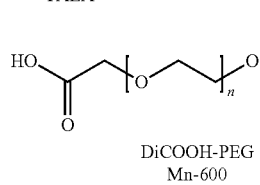
DiCOOH-PEG
Mn-600

+ SiO₂

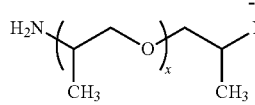
Jeffamines
D-400  x = ~6.1
D-2000 x = ~33

+

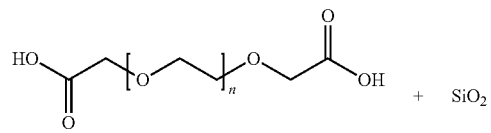
DiCOOH-PEG
Mn (250 and 600)

+ SiO₂

The relative permittivities of the above supramolecular structures were determined as described in Example 2.

TABLE 3

Relative permittivities ($\in'$) of ionic supramolecular structures.

| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
|---|---|---|---|---|---|---|---|---|---|
| 1 | HMDA + DiCOOH-PEG 600 (1:1) + 10% SiO₂ | $2.08 \cdot 10^6$ | $7.49 \cdot 10^5$ | $2.43 \cdot 10^5$ | $3.38 \cdot 10^4$ | $1.52 \cdot 10^3$ | 54.7 | 23.6 | 12.20 |
| 2 | TAEA + DiCOOH-PEG 600 (1:1.5) + 10% SiO₂ | $7.21 \cdot 10^5$ | $7.16 \cdot 10^4$ | $4.63 \cdot 10^3$ | 81.38 | 17.16 | 10.82 | 7.06 | 5.09 |
| 3 | D400 + DiCOOH-PEG 250 (1:1) + 10% SiO₂ | $4.82 \cdot 10^5$ | $1.13 \cdot 10^5$ | $7.61 \cdot 10^3$ | $1.20 \cdot 10^2$ | 17.24 | 12.12 | 6.06 | 3.94 |
| 4 | D2000 + DiCOOH-PEG 250 (1:1) + 10% SiO₂ | $2.06 \cdot 10^5$ | $5.05 \cdot 10^4$ | $2.47 \cdot 10^3$ | 59.38 | 12.25 | 10.57 | 8.84 | 6.86 |
| 5 | D400 + DiCOOH-PEG 600 (1:1) + 10% SiO₂ | $1.77 \cdot 10^6$ | $7.29 \cdot 10^5$ | $1.17 \cdot 10^5$ | $7.90 \cdot 10^3$ | $1.34 \cdot 10^2$ | 25.10 | 55.67 | 12.63 |
| 6 | D2000 + DiCOOH-PEG 600 (1:1) + 10% SiO₂ | $4.37 \cdot 10^5$ | $1.15 \cdot 10^5$ | $1.10 \cdot 10^4$ | $2.48 \cdot 10^2$ | 15.61 | 10.86 | 9.82 | 8.11 |

EXAMPLE 4

Preparation of ionic supramolecular structures containing aminopropyl terminated polydimethylsiloxanes and Dicooh-PEG.

The following ionic supramolecular structures were prepared in a manner analogously to the procedure of example 1. Heating was not applied in this example.

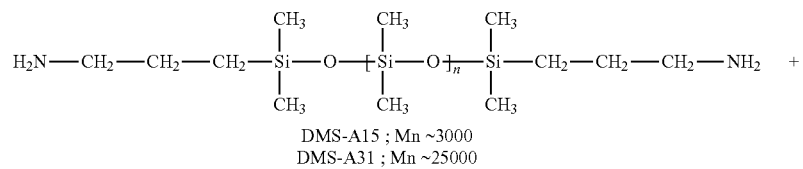
DMS-A15 ; Mn ~3000
DMS-A31 ; Mn ~25000

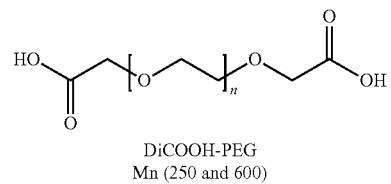
DiCOOH-PEG
Mn (250 and 600)

The relative permittivities of the above supramolecular structures were determined as described in Example 2.

TABLE 4

Relative permittivities (∈') of ionic supramolecular structures.

| | | Relative permittivities (∈') | | | | | | | |
|---|---|---|---|---|---|---|---|---|---|
| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | DMS-A15 + DiCOOH-PEG 250 (1:1) | $5.27 \cdot 10^7$ | $5.29 \cdot 10^4$ | $3.03 \cdot 10^3$ | 81.4 | 27.4 | 22.3 | 14.4 | 9.58 |
| 2 | DMS-A31 + DiCOOH-PEG 250 (1:1) | 3.17 | 3.12 | 3.11 | 3.10 | 3.10 | 3.10 | 3.10 | 3.09 |
| 3 | DMS-A15 + DiCOOH-PEG 600 (1:1) | $1.22 \cdot 10^5$ | $2.47 \cdot 10^4$ | $1.41 \cdot 10^3$ | 34.6 | 11.0 | 9.65 | 6.15 | 4.77 |
| 4 | DMS-A31 + DiCOOH-PEG 600 (1:1) | 6.28 | 3.61 | 2.87 | 2.59 | 2.19 | 2.17 | 2.15 | 2.13 |

EXAMPLE 5

The following ionic supramolecular structures were prepared in a manner analogously to the procedure of example 1. Heating was not applied in this example.

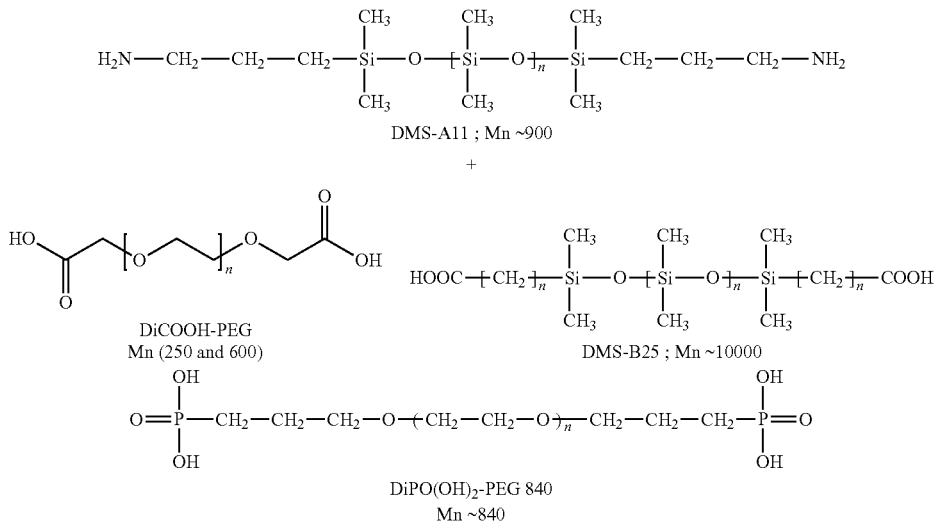

The relative permittivities of the above supramolecular structures were determined as described in Example 2.

TABLE 5

Relative permittivities (∈') of ionic supramolecular structures.

| | | Relative permittivities (∈') | | | | | | | |
|---|---|---|---|---|---|---|---|---|---|
| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | DMS-A11 + DiCOOH-PEG 250 (1:1) | $2.02 \cdot 10^6$ | $8.04 \cdot 10^5$ | $2 \cdot 10^5$ | $2.32 \cdot 10^4$ | $7.54 \cdot 10^2$ | 29.0 | 14.5 | 9.41 |
| 2 | DMS-A11 + DiCOOH-PEG 600 (1:1) | $1.44 \cdot 10^6$ | $5 \cdot 10^5$ | $1.18 \cdot 10^5$ | $1.16 \cdot 10^4$ | $2.26 \cdot 10^2$ | 21.0 | 35.0 | 11.7 |
| 3 | DMS-A11 + DiPO(OH)$_2$-PEG 840 (2:1)* | $2.05 \cdot 10^4$ | $3.13 \cdot 10^3$ | $3.91 \cdot 10^2$ | 28.0 | 5.62 | 4.12 | 3.22 | 2.78 |
| 4 | DMS-A11 + DMS-B25 (1:1) | 8.16 | 4.81 | 3.78 | 3.24 | 3.18 | 3.16 | 3.15 | 3.13 |

*Solid-like

EXAMPLE 6

Ionic supramolecular structures containing multifunctional carboxylic acids and aminopropyl Terminated polydimethylsiloxanes.

The following ionic supramolecular structures were prepared in a manner analogously to the Procedure of example 1. The mixtures were subjected to heating for 25 min at 100° C., 25 min At 150° C. And finally 30 min at 200° C. Since the carboxylic acids (CA, TCAA, TMA, EDTA and DETPA) are solid at room temperature and have moderate-high melting points.

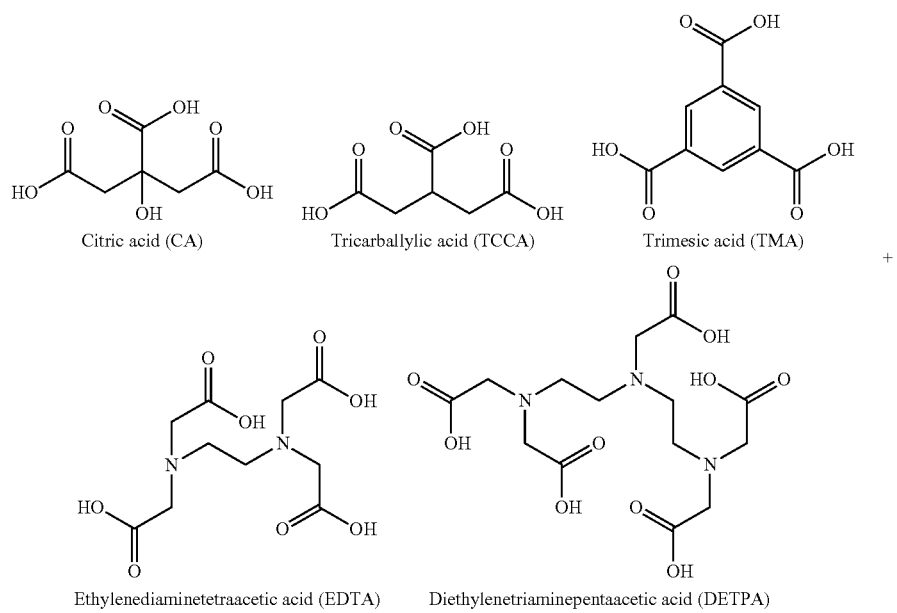

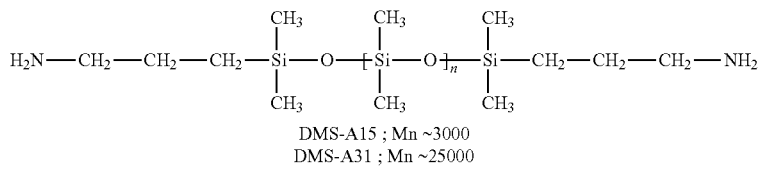

DMS-A15 ; Mn ~3000
DMS-A31 ; Mn ~25000

Their relative permittivities were determined as described in example 2.

TABLE 6

Relative permittivities (∈') of ionic supramolecular structures.

| | | Relative permittivities (∈') | | | | | | | |
|---|---|---|---|---|---|---|---|---|---|
| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | TCAA + DMS-A15 (1:1.5) | $5.06 \cdot 10^2$ | 24.1 | 4.36 | 4.02 | 3.98 | 3.88 | 3.77 | 3.63 |
| 2 | TCAA + DMS-A31 (1:1.5) | 2.99 | 2.95 | 2.91 | 2.90 | 2.90 | 2.89 | 2.87 | 2.87 |
| 3 | CA + DMS-A15 (1:1.5) | 13.2 | 8.64 | 7.85 | 5.45 | 4.16 | 3.39 | 2.47 | 2.27 |
| 4 | CA + DMS-A31 (1:1.5) | 3.51 | 3.25 | 2.66 | 2.41 | 2.14 | 2.04 | 1.72 | 1.66 |
| 5 | EDTA + DMS-A15 (1:2) | 18.6 | 6.21 | 3.75 | 3.46 | 3.08 | 2.72 | 2.49 | 2.36 |
| 6 | EDTA + DMS-A31 (1:2) | 2.52 | 1.82 | 1.70 | 1.65 | 1.59 | 1.49 | 1.31 | 1.29 |
| 7 | DETPA + DMS-A15 (1:2) | 58.6 | 9.21 | 4.33 | 3.46 | 2.77 | 2.22 | 2.07 | 2.01 |
| 8 | DETPA + DMS-A31 (1:2) | 7.0 | 2.81 | 2.31 | 2.25 | 2.24 | 2.23 | 2.23 | 2.23 |

EXAMPLE 7

Preparation of Ionic Supramolecular Structures Containing Diphosphonic Peg Acids The following ionic supramolecular structures were prepared in a manner analogously to the procedure of example 1. Heating was not applied in this example.

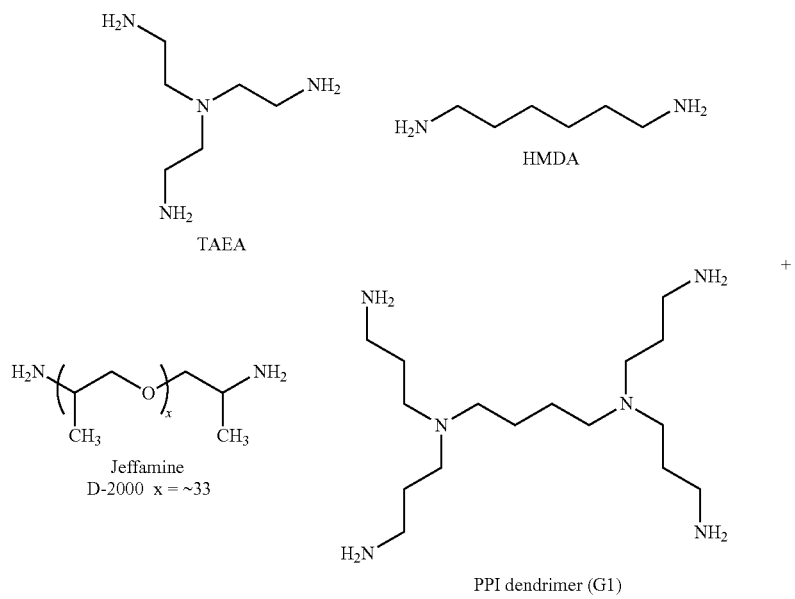

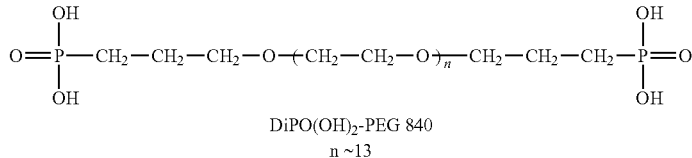

DiPO(OH)$_2$-PEG 840
n ~13

The relative permittivities of these were determined as described in example 2.

TABLE 7

Relative permittivities ($\varepsilon'$) of ionic supramolecular structures.

| | | Relative permittivities ($\varepsilon'$) | | | | | | |
|---|---|---|---|---|---|---|---|---|
| Entry | Composition | 0.20 Hz | 2.00 Hz | 7.68 Hz | $1.13 \cdot 10^2$ Hz | $1.20 \cdot 10^3$ Hz | $2.34 \cdot 10^3$ Hz | $1.33 \cdot 10^5$ Hz | $10^6$ Hz |
| 1 | DiCOOH-PEG 250 | $2.58 \cdot 10^6$ | $5.34 \cdot 10^5$ | $1.91 \cdot 10^5$ | $8.48 \cdot 10^3$ | $2.12 \cdot 10^2$ | 88.4 | 91.3 | 29.6 |
| 2 | DiCOOH-PEG 600 | $2.72 \cdot 10^5$ | $4.81 \cdot 10^4$ | $1.16 \cdot 10^4$ | $2.08 \cdot 10^2$ | 16.3 | 13.8 | 11.5 | 11.1 |
| 3 | DiPO(OH)$_4$-PEG 840 | $8.45 \cdot 10^8$ | $4.19 \cdot 10^7$ | $3.39 \cdot 10^7$ | $3.24 \cdot 10^6$ | $2.36 \cdot 10^6$ | $4.71 \cdot 10^5$ | $1.29 \cdot 10^5$ | $1 \cdot 10^4$ |
| 4 | HMDA + DiPO(OH)$_4$-PEG 840 (2:1) "solid-powder" | $7.05 \cdot 10^8$ | $9 \cdot 10^7$ | $3.33 \cdot 10^7$ | $2.17 \cdot 10^6$ | $1.73 \cdot 10^6$ | $3.86 \cdot 10^5$ | $2.86 \cdot 10^5$ | $1.03 \cdot 10^4$ |
| 5 | TAEA + DiPO(OH)$_4$-PEG 840 (1:0.75) | $2.90 \cdot 10^8$ | $2.52 \cdot 10^7$ | $5.97 \cdot 10^6$ | $6.16 \cdot 10^5$ | $4.85 \cdot 10^5$ | $2.03 \cdot 10^5$ | $9.99 \cdot 10^4$ | $9.97 \cdot 10^3$ |
| 6 | PPI G1 + DiPO(OH)$_4$-PEG 840 (1:1) "solid-powder" | $2.25 \cdot 10^9$ | $1.60 \cdot 10^7$ | $1.81 \cdot 10^7$ | $1.36 \cdot 10^6$ | $9.39 \cdot 10^5$ | $3.73 \cdot 10^5$ | $1.92 \cdot 10^5$ | $1.04 \cdot 10^4$ |
| 7 | D2000 + DiPO(OH)$_4$-PEG 840 (1:1) | $3.18 \cdot 10^3$ | $7.65 \cdot 10^2$ | $1.29 \cdot 10^2$ | 20.1 | 5.13 | 3.55 | 3.31 | 3.06 |

EXAMPLE 8

Preparation of Ionic Supramolecular Structures Prepared with Carboxylate Functional Silicones.

The following ionic supramolecular structures were prepared in a manner analogously to the procedure of example 1. Heating was not applied in this example.

H₂N–HMDA–NH₂ (HMDA: hexamethylenediamine)

TAEA

Jeffamines
D-400 x = ~6.1
D-2000 x = ~33

PPI dendrimer (G1)

PPI dendrimer (G2)

$$HOOC\text{-}(CH_2)_n\text{-}Si(CH_3)_2\text{-}O\text{-}[Si(CH_3)_2\text{-}O]_n\text{-}Si(CH_3)_2\text{-}(CH_2)_n\text{-}COOH$$

DMS-B25 ; Mn ~10000

Their relative permittivities were determined as disclosed in example 2 and were as shown below.

TABLE 8

Relative permittivities ($\varepsilon'$) of ionic supramolecular structures.

| Entry | Composition | 0.10 Hz | 0.20 Hz | 1.02 Hz | 2.00 Hz | 7.68 Hz |
|---|---|---|---|---|---|---|
| 1 | HMDA + DMS-B25 (1:1) | $1.24 \cdot 10^9$ | $2.44 \cdot 10^7$ | $2.14 \cdot 10^7$ | $2.98 \cdot 10^7$ | $1.18 \cdot 10^7$ |
| 2 | TAEA + DMS-B25 (1:1.5) | $3.05 \cdot 10^8$ | $5.30 \cdot 10^8$ | $3.12 \cdot 10^7$ | $2.24 \cdot 10^7$ | $2.54 \cdot 10^7$ |
| 3 | PPI G1 + DMS-B25 (1:2) | $6.17 \cdot 10^8$ | $4.40 \cdot 10^8$ | $2.73 \cdot 10^7$ | $1.91 \cdot 10^7$ | $1.25 \cdot 10^7$ |
| 4 | PPI G2 + DMS-B25 (1:4) | $8.41 \cdot 10^8$ | $4.89 \cdot 10^8$ | — | $2.15 \cdot 10^7$ | $1.16 \cdot 10^7$ |
| 5 | D400 + DMS-B25 (1:1) | $1.73 \cdot 10^8$ | $1.12 \cdot 10^8$ | $1.55 \cdot 10^7$ | $9.47 \cdot 10^6$ | $5.18 \cdot 10^6$ |
| 6 | D2000 + DMS-B25 (1:1) | 4.43 | 4.24 | 4.06 | 4.04 | 4.00 |

| Entry | 10.80 Hz | $1.13 \cdot 10^2$ Hz | $1.20 \cdot 10^3$ Hz | $2.34 \cdot 10^3$ Hz | $1.33 \cdot 10^5$ Hz | $10^6$ Hz |
|---|---|---|---|---|---|---|
| 1 | $6.67 \cdot 10^6$ | $1.15 \cdot 10^6$ | $8.95 \cdot 10^5$ | $4.17 \cdot 10^5$ | $1.06 \cdot 10^5$ | $1.02 \cdot 10^4$ |
| 2 | $1.02 \cdot 10^7$ | $1.45 \cdot 10^6$ | $1.31 \cdot 10^6$ | $5.53 \cdot 10^5$ | $1.32 \cdot 10^5$ | $1.03 \cdot 10^4$ |
| 3 | $5.30 \cdot 10^6$ | $1.43 \cdot 10^6$ | $1.25 \cdot 10^6$ | $7.57 \cdot 10^5$ | $1.50 \cdot 10^5$ | $1.03 \cdot 10^4$ |
| 4 | $3.81 \cdot 10^6$ | $1.51 \cdot 10^6$ | $1.05 \cdot 10^6$ | $5.02 \cdot 10^5$ | $1.30 \cdot 10^5$ | $1.03 \cdot 10^4$ |
| 5 | $8.33 \cdot 10^5$ | $4.89 \cdot 10^5$ | $3.84 \cdot 10^5$ | $2.02 \cdot 10^5$ | $5.77 \cdot 10^4$ | $9.84 \cdot 10^3$ |
| 6 | 3.99 | 3.78 | 2.53 | 2.32 | 2.12 | 2.09 |

EXAMPLE 9

Preparation of Ionic Supramolecular Structures of Aminopropylmethylsiloxane-Dimethylsiloxane Copolymers and Different Dicarboxylate or Diphosphonic Compounds The following ionic supramolecular structures were prepared in a manner analogously to the procedure of example 1. Heating was not applied in this example.

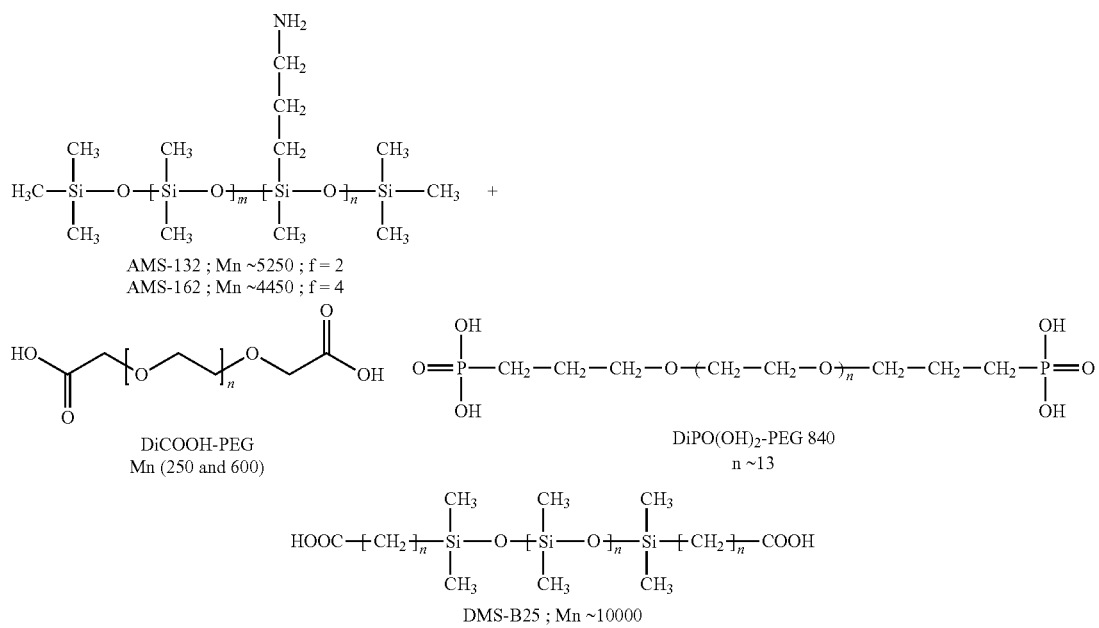

AMS-132; Mn ~5250; f = 2
AMS-162; Mn ~4450; f = 4

DiCOOH-PEG
Mn (250 and 600)

DiPO(OH)$_2$-PEG 840
n ~13

DMS-B25; Mn ~10000

Their relative permittivities were determined as described in example 2 and appear from table 9 below.

TABLE 9

Relative permittivities ($\in'$) of ionic supramolecular structures.

| Entry | Composition | Relative permittivities ($\in'$) | | | | |
|---|---|---|---|---|---|---|
| | | 0.10 Hz | 0.20 Hz | 1.02 Hz | 2.00 Hz | 7.68 Hz |
| 1 | AMS-132 + DiCOOH-PEG 250 (1:1) | $1.31 \cdot 10^9$ | $4.24 \cdot 10^8$ | $8.97 \cdot 10^7$ | $1.34 \cdot 10^8$ | $5.42 \cdot 10^7$ |
| 2 | AMS-132 + DiCOOH-PEG 600 (1:1) | $4.88 \cdot 10^9$ | $1.32 \cdot 10^8$ | $1.24 \cdot 10^8$ | $8.67 \cdot 10^7$ | $5.01 \cdot 10^7$ |
| 3 | AMS-132 + DiPO(OH)$_4$-PEG 840 (2:1) | $9.51 \cdot 10^9$ | $3.09 \cdot 10^9$ | $4.18 \cdot 10^6$ | $1.16 \cdot 10^8$ | $8.99 \cdot 10^7$ |
| 4 | AMS-132 + DMS-B25 (1:1) | $7.31 \cdot 10^9$ | $3.42 \cdot 10^9$ | $3.65 \cdot 10^8$ | $2.11 \cdot 10^7$ | $5.86 \cdot 10^7$ |
| 5 | AMS-162 + DiCOOH-PEG 250 (1:2) | $5.83 \cdot 10^9$ | $1.66 \cdot 10^8$ | $4.05 \cdot 10^7$ | $1.17 \cdot 10^8$ | $9.72 \cdot 10^7$ |
| 6 | AMS-162 + DiCOOH-PEG 600 (1:2) | $5.13 \cdot 10^9$ | $1.41 \cdot 10^9$ | $5.86 \cdot 10^7$ | $1.00 \cdot 10^7$ | $2.47 \cdot 10^7$ |
| 7 | AMS-162 + DiPO(OH)$_4$-PEG 840 (1:1) | $4.97 \cdot 10^9$ | $3.70 \cdot 10^8$ | $3.94 \cdot 10^7$ | $1.12 \cdot 10^7$ | $2.03 \cdot 10^7$ |
| 8 | AMS-162 + DMS-B25 (1:2) | $4.36 \cdot 10^9$ | $1.07 \cdot 10^9$ | $1.34 \cdot 10^8$ | $3.93 \cdot 10^7$ | $9.42 \cdot 10^7$ |

| Entry | Relative permittivities ($\in'$) | | | | | |
|---|---|---|---|---|---|---|
| | 10.80 Hz | $1.13 \cdot 10^2$ Hz | $1.20 \cdot 10^3$ Hz | $2.34 \cdot 10^3$ Hz | $1.33 \cdot 10^5$ Hz | $10^6$ Hz |
| 1 | $4.06 \cdot 10^7$ | $1.28 \cdot 10^7$ | $1.09 \cdot 10^7$ | $8.65 \cdot 10^5$ | $1.37 \cdot 10^5$ | $1.01 \cdot 10^4$ |
| 2 | $2.76 \cdot 10^7$ | $8.22 \cdot 10^6$ | $6.62 \cdot 10^6$ | $4.64 \cdot 10^6$ | $1.13 \cdot 10^5$ | $1.00 \cdot 10^4$ |
| 3 | $1.23 \cdot 10^6$ | $7.16 \cdot 10^6$ | $6.55 \cdot 10^6$ | $3.39 \cdot 10^6$ | $1.31 \cdot 10^5$ | $1.01 \cdot 10^4$ |
| 4 | $3.26 \cdot 10^6$ | $8.22 \cdot 10^6$ | $6.83 \cdot 10^6$ | $3.93 \cdot 10^6$ | $1.76 \cdot 10^5$ | $1.03 \cdot 10^4$ |
| 5 | $4.82 \cdot 10^7$ | $7.41 \cdot 10^6$ | $6.98 \cdot 10^6$ | $3.90 \cdot 10^6$ | $2.14 \cdot 10^5$ | $1.03 \cdot 10^4$ |
| 6 | $7.25 \cdot 10^6$ | $2.59 \cdot 10^6$ | $2.46 \cdot 10^6$ | $1.21 \cdot 10^6$ | $1.68 \cdot 10^5$ | $1.03 \cdot 10^4$ |
| 7 | $4.56 \cdot 10^6$ | $2.81 \cdot 10^6$ | $2.05 \cdot 10^6$ | $8.68 \cdot 10^5$ | $1.75 \cdot 10^5$ | $1.04 \cdot 10^4$ |
| 8 | $3.38 \cdot 10^7$ | $6.00 \cdot 10^6$ | $6.00 \cdot 10^6$ | $2.52 \cdot 10^6$ | $2.46 \cdot 10^5$ | $1.04 \cdot 10^4$ |

EXAMPLE 10

Preparation of Non-Ionic Supramolecular Structures

The below non-ionic supramolecular structures were prepared in a manner analogously to the procedure of example 1, however with one of the components in excess (non-stoichiometric ratio). Their relative permittivities appear from the table below, entries 2 and 3, compared to a corresponding ionic supramolecular structure, entry 1, taken from entry 7 in table 1. Heating was not applied in this example.

TABLE 10

Relative permittivities (∈') of ionic supramolecular structures.

| | | Relative permittivities (∈') | | | | | | | |
|---|---|---|---|---|---|---|---|---|---|
| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | PPI G1 + DiCOOH-PEC 600 (1:2) | $1.3 \cdot 10^6$ | $3.8 \cdot 10^5$ | $6.3 \cdot 10^4$ | $4.7 \cdot 10^3$ | $1.6 \cdot 10^2$ | 47 | 69 | 14.3 |
| 2 | PPI G1 + DiCOOH-PEG 600 (1:3) | 79.2 | 21.2 | 7.29 | 5.33 | 5.06 | 4.97 | 4.42 | 3.74 |
| 3 | PPI G1 + DiCOOH-PEG 600 (1:4) | $6.21 \cdot 10^2$ | $1.39 \cdot 10^2$ | 30.5 | 8.63 | 5.48 | 5.17 | 4.70 | 3.98 |

EXAMPLE 11

Preparation of Ionic Interpenetrating Networks

The following ionic interpenetrating networks were prepared in a manner analogously to the procedure described in example 2, however wherein the curing time was 1 day at 80° C. and about 6 hours at 110° C. The thickness of the samples ranged from 0.8-1.6 mm.

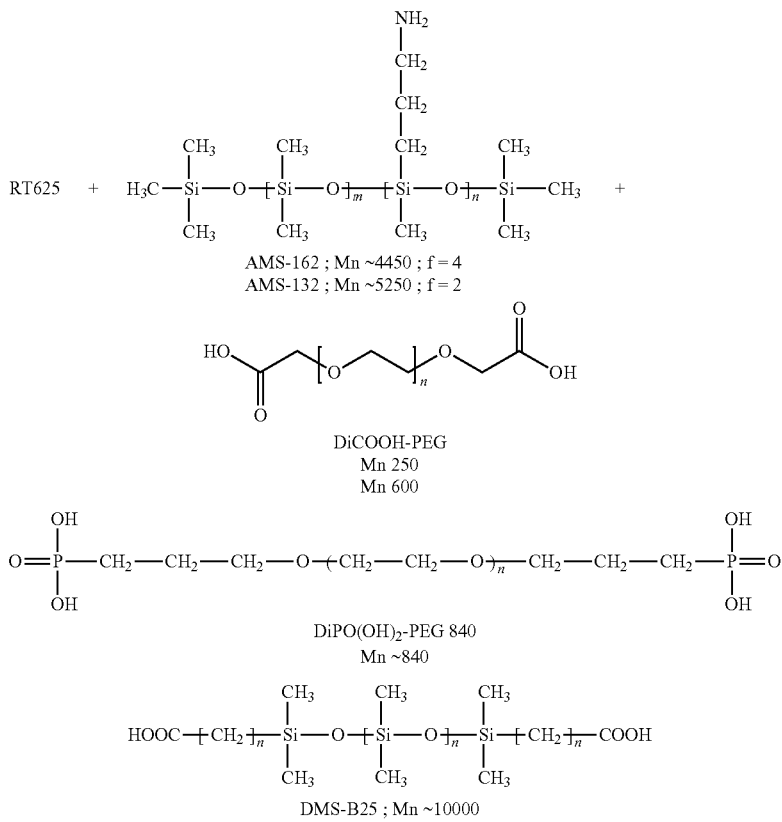

Their relative permittivities were determined as described in example 2 and appear from the table below.

TABLE 11

Relative permittivities (∈') of ionic supramolecular structures.

| | | Relative permittivities (∈') | | | | | | | |
|---|---|---|---|---|---|---|---|---|---|
| Entry | Composition | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | RT625 + (AMS-162 + DiCOOH-PEG 250 (1:2)) (1:1) | 12.1 | 11.0 | 7.4 | 5.5 | 4.6 | 4.0 | 3.6 | 3.4 |

TABLE 11-continued

Relative permittivities (∈') of ionic supramolecular structures.

| Entry | Composition | Relative permittivities (∈') | | | | | | | |
|---|---|---|---|---|---|---|---|---|---|
| | | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 2 | RT625 + (AMS-162 + DiCOOH-PEG 600 (1:2)) (1:1) | 15.0 | 13.0 | 9.2 | 7.4 | 6.0 | 4.7 | 4.0 | 3.9 |
| 3 | RT625 + (AMS-162 + DiCOOH-PEG 600 (1:2)) (1:1) + 10% $SiO_2$ | 176.0 | 94.1 | 69.2 | 31.0 | 13.8 | 7.6 | 5.1 | 4.4 |
| 4 | RT625 + (AMS-162 + $DiPO(OH)_2$-PEG 840 (1:1)) (1:1) | 67.0 | 57.3 | 33.4 | 14.0 | 6.7 | 5.6 | 5.0 | 4.4 |
| 5 | RT625 + (AMS-162 + DMS-B25 (1:2)) (1:1) | 3.5 | 3.1 | 3.0 | 3.0 | 3.0 | 3.0 | 2.9 | 2.9 |
| 6 | RT625 + (AMS-132 + DiCOOH-PEG 600 (1:1)) (1:1) | 7.6 | 5.2 | 4.5 | 4.3 | 4.2 | 3.9 | 3.7 | 3.6 |
| 7 | RT625 + (AMS-132 + DMS-B25 (1:1)) (1:1) | 2.9 | 2.8 | 2.7 | 2.7 | 2.6 | 2.6 | 2.6 | 2.6 |

EXAMPLE 12

The following ionic interpenetrating networks were prepared in a manner analogously to the procedure described in example 2, however wherein the curing time was 1 day at 80° C. and 3 hours at 110° C. The thickness of the samples ranged from 0.9-1.8 mm. Their relative permittivities were determined as described in example 2 and appear from the table below.

TABLE 12

Relative permittivities (∈') of ionic supramolecular structures.

| Entry | Composition | Relative permittivities (∈') | | | | | | | |
|---|---|---|---|---|---|---|---|---|---|
| | | 0.1 Hz | 1.02 Hz | $1.08 \cdot 10^1$ Hz | $1.13 \cdot 10^2$ Hz | $1.20 \cdot 10^3$ Hz | $1.26 \cdot 10^4$ Hz | $1.33 \cdot 10^5$ Hz | $10^6$ Hz |
| 1 | RT625 + (IAEA + DiCOOH-PEG 250 (1:1.5)) (1:1) | 12.4 | 8.6 | 6.2 | 5.6 | 5.3 | 5.1 | 4.8 | 4.6 |
| 2 | RT625 + (IAEA + DiCOOH-PEG 600 (1:1.5)) (1:1) | 69.4 | 23.7 | 18.6 | 16.6 | 14.2 | 13.0 | 10.2 | 7.8 |
| 3 | RT625 + (PPI G2 + DiCOOH-PEG 250 (1:4)) (1:1) | 84.6 | 47.9 | 30.9 | 22.5 | 17.8 | 12.9 | 8.6 | 6.6 |
| 4 | RT625 + (PPI G2 + DiCOOH-PEG 600 (1:4)) (1:1) | $4.3 \cdot 10^3$ | 720 | 143 | 38.7 | 18.7 | 11.2 | 7.0 | 5.5 |
| 5 | RT625 + (PPI G1 + $DiPO(OH)_2$-PEG 840 (1:1)) (1:1) | $1.4 \cdot 10^4$ | $1.4 \cdot 10^3$ | 196 | 82.3 | 39.5 | 20.1 | 10.7 | 7.2 |
| 6 | RT625 + (PPI G2 + $DiPO(OH)_2$-PEG 840 (1:2)) (1:1) | $7.2 \cdot 10^4$ | $5.7 \cdot 10^3$ | 468 | 157 | 72.0 | 30.7 | 14.6 | 9.5 |

The invention claimed is:

1. An ionic interpenetrating polymer network suitable for use as a dielectric electroactive polymer (DEAP) comprising:
   i) At least one elastomer selected from the group consisting of silicone rubber, fluorosilicone rubber, and mixtures thereof; and
   ii) An ionic supramolecular structure comprising the reaction product of at least two chemical compounds wherein each of said compounds has at least two functional groups and wherein said compounds are able to undergo Lewis acid-base reactions,
   wherein the DEAP is non-conductive.

2. The ionic interpenetrating polymer network according to claim 1, wherein the silicone rubber is selected from the group consisting of polysiloxane rubbers.

3. The ionic interpenetrating polymer network according to claim 1, wherein the ionic supramolecular structure comprises the reaction product of at least two chemical compounds, of which at least one of said compounds comprises a backbone selected from the group consisting of poly(ethylene) glycol, poly(propylene) glycol, polysiloxane, polyalkylsiloxane, polyurethane and mixtures thereof.

4. The ionic interpenetrating polymer network according to claim 3, wherein the backbone is selected from the group consisting of poly(ethylene) glycol, poly(propylene) glycol, polydimethylsiloxane and mixtures thereof.

5. The ionic interpenetrating polymer network according to claim 1, wherein one of said chemical compounds comprises at least two amine functional groups and is selected from the group consisting of $NH_2$—$R^1$—$NH_2$, wherein $R^1$ is selected from the group consisting of linear and branched $C_{1-24}$ alkyl and $C_{2-24}$alkenyl and cyclic $C_{3-24}$alkyl and $C_{3-24}$alkenyl, optionally substituted by one or more substituents selected from the group consisting of halogen, amino, nitro, hydroxyl, and $CF_3$; di- or triamino-$C_{1-24}$alkylamine, wherein the alkyl moiety thereof is linear or branched $C_{1-24}$alkyl or cyclic $C_{3-24}$alkyl, optionally substituted by one or more substituents selected from the group consisting of halogen, amino, nitro, hydroxyl, and $CF_3$; di- or triamino-$C_{2-24}$alkenylamine, wherein the alkenyl moiety thereof is linear or branched $C_{2-24}$alkenyl or cyclic $C_{3-24}$alkenyl, optionally substituted by one or more substituents selected from the group consisting of halogen, amino, nitro, hydroxyl, and $CF_3$; di-, tri- or tetraamino-substituted aromatic or heteroaromatic compounds, which compounds are optionally substituted by one or more substituents selected from the group consisting of halogen, amino, nitro, hydroxyl, and $CF_3$; poly(ethylene imine) dendrimers; poly(propylene imine) dendrimers; poly(ethylene glycol) diamine; poly(propylene glycol) diamine; poly(ethylene glycol)/poly(propylene glycol) diamine; poly(ethylene glycol) triamine; poly(propylene glycol) triamine; poly(ethylene glycol)/poly(propylene glycol) triamine; and amino-$C_{1-6}$alkyl terminated polyalkylsiloxane.

6. The ionic interpenetrating polymer network according to claim 5, wherein said chemical compound comprising at least two amine functional groups is selected from the group consisting of 1,3-diaminopropane, 1,4-diaminobutane, 1,5-diaminopentane, hexamethylene diamine (HMDA), 1,10-decanediamine, 2,4,6-triaminopyrimidine (TAP), (tris-2-aminoethyl) amine (TAEA), 3,3'-diaminobenzidine (DAB), poly(propylene imine) dendrimer (G1), poly(propylene imine) dendrimer (G2), poly(propylene imine) dendrimer (G3), poly(propylene glycol) diamine, poly(ethylene glycol) diamine, poly(ethylene glycol)/poly(propylene glycol) diamine, poly(propylene glycol) triamine, poly(ethylene glycol) triamine, poly(ethylene glycol)/poly(propylene glycol) triamine, aminopropyl terminated polydimethylsiloxane (ATDMS) and copolymers of aminoalkylmethylsiloxane and dimethylsiloxane.

7. The ionic interpenetrating polymer network according to claim 1, wherein one of said chemical compounds comprises at least two carboxy, sulfonic or phosphonic acid functional groups and is selected from the group consisting of di-, tri- or tetra-carboxy-, di-, tri- or tetra-sulfonic or di-, tri- or tetraphosphonic acid-substituted linear or branched, saturated or unsaturated aliphatic, aromatic or heteroaromatic compounds optionally substituted by one or more substituents selected from the group consisting of halogen, amino, nitro, hydroxyl, and $CF_3$; alkylenediaminetetracarboxylic acid; dialkylenetriaminepentacarboxylic acid, poly(ethylene glycol)biscarboxymethyl ether, poly(propylene glycol)biscarboxymethyl ether, α,ω-disulfonate-functionalized poly(ethylene glycol) and α,ω-disulfonate-functionalized poly(propylene glycol).

8. The ionic interpenetrating polymer network according to claim 7, wherein said chemical compound comprising at least two carboxy, sulfonic or phosphonic acid functional groups is selected from the group consisting of citric acid (CA), tricarballylic acid (TCAA), trimesic acid (TMA), ethylenediaminetetraacetic acid (EDTA), diethylenetriaminepentaacetic acid (DETPA), poly(ethylene glycol)biscarboxymethyl ether, poly(propylene glycol)biscarboxymethyl ether, α,ω-disulfonate-functionalized poly(ethylene glycol), α,ω-disulfonate-functionalized poly(propylene glycol) and α,ω-dicarboxylate-functionalized dimethylsiloxane.

9. The ionic interpenetrating polymer network according to claim 1, further comprising one or more additives.

10. The ionic interpenetrating polymer network according to claim 1, having a relative dielectric permittivity ∈r at 0.1 Hz of at least $1 \times 10^1$.

11. A method for preparing the ionic interpenetrating polymer network according to claim 1 comprising the steps of:
i) mixing said at least two chemical compounds, optionally by the addition of heat, to obtain said ionic supramolecular structure; and
ii) Mixing the ionic supramolecular structure obtained in step i), optionally by the addition of heat, with at least one elastomer.

12. A method for preparing the ionic interpenetrating polymer network according to claim 1 comprising the step of mixing said at least two chemical compounds with at least one elastomer, optionally by the addition of heat.

13. The method according to claim 11, wherein said at least two chemical compounds are used in stoichiometric amounts of said at least two chemical compounds.

14. The method according to claim 11, wherein the preparation of the ionic interpenetrating polymer network according to claim 1 is performed by mixing of amounts of said ionic supramolecular structure and said at least one elastomer in the range 1:9 to 2:1 by weight.

15. A dielectric electroactive polymer (DEAP) comprising the ionic, interpenetrating polymer network according claim 1.

16. The ionic interpenetrating polymer network according to claim 2, wherein the polysiloxane rubber is a polyalkylsiloxane rubber.

17. The ionic interpenetrating polymer network according to claim 16, wherein the polyalkylsiloxane rubber is a polydimethylsiloxane (PDMS) rubber.

18. The ionic interpenetrating polymer network according to claim 9, wherein the additive is selected from the group consisting of $SiO_2$, $TiO_2$, $BaTiO_3$, and $CaCu_3Ti_4O_{12}$.

19. The ionic interpenetrating polymer network according to claim 10, having a relative dielectric permittivity ∈r at 0.1 Hz selected from the group consisting of at least $1 \times 10^2$, at least $1 \times 10^3$, at least $1 \times 10^4$, at least $1 \times 10^5$, and at least $1 \times 10^6$.

* * * * *